United States Patent [19]

Freeman et al.

[11] Patent Number: 4,632,398
[45] Date of Patent: Dec. 30, 1986

[54] RESET SYSTEM FOR MICROCOMPUTER USING PROGRAM CARTRIDGES

[75] Inventors: Joseph W. Freeman, Columbia, Tenn.; Gary E. Webb, Lake Worth, Fla.

[73] Assignee: International Business Machines Corporation, Armonk, N.Y.

[21] Appl. No.: 522,894

[22] Filed: Aug. 12, 1983

[51] Int. Cl.⁴ ............................................. A63B 71/00
[52] U.S. Cl. .................................................. 273/148 B
[58] Field of Search ............................... 364/200, 900; 273/148 B

[56] References Cited

U.S. PATENT DOCUMENTS 4,368,515  1/1983  Nielsen ................................. 364/200
4,462,076  7/1984  Smith, III ............................ 364/200
4,471,465  9/1984  Mayer et al. ......................... 364/900
4,480,835  11/1984  Williams ............................ 273/148 B Primary Examiner—Gareth D. Shaw
Assistant Examiner—John G. Mills

[57] ABSTRACT

Cartridges for a microcomputer have two adjacent edge connectors replaced by a single connector with a projection which passes into the area in which the adjacent connector would normally be placed. When the cartridge is inserted or removed from the connector socket in the microcomputer the projection transiently contacts the associated socket contact. A fixed potential (for example earth potential) normally applied to the main portion of the edge connector from its associated socket contact is therefore transferred to the transiently contacted socket contact to provide a reset signal for the microprocessor of the microcomputer. Thus, the microprocessor is reset each time a cartridge is inserted or withdrawn.

4 Claims, 3 Drawing Figures

RESET SYSTEM FOR MICROCOMPUTER USING PROGRAM CARTRIDGES

DESCRIPTION

1. Technical Field

The present invention relates to microcomputer systems, and in particular to such systems which accept and utilize program cartridges and the connection arrangements for such cartridges.

2. Background Art

Program cartridges were first introduced into the computer field in the area of games computers. Essentially, these devices are read-only stores which provide additional programming features to those held in a internal read-only memory in the micro-computer itself. In a games computer system, for example, the cartridges hold control programs defining the characteristics of the different games which may be played on the system. U.S. Pat. No. 4,149,027 (Asher and Hardy) shows such a games cartridge. While the greatest proportion of cartridges marketed at this time relate to games applications, they are beginning to be used for other applications. As they provide an extension of the internal control program in a microcomputer, they can be powerful tools in extending the capability of such systems in business and other professional applications. However, the fact that they contain control program data leads to one particular disadvantage. When a cartridge is installed or removed from a computer while the system is running, noise may be introduced into the address and data lines of the system as contacts between the cartridge and the receiving socket are made or broken respectively. This can lead to unpredictable loss of control of the system. In many cases, the only way to regain control is to switch the system off temporarily. Thereafter, as it powers up, control is again restored. This process is perfectly adequate for games computers and simple systems, as the power up time is relatively short. However, for more complex systems, particularly those using peripheral devices, such as diskette and hard disk files, the power up time is substantially longer and presents considerable inconvenience to the user.

It is, therefore, an object of the present invention to provide a resetting arrangement which is inexpensive and effective to prevent the requirement to switch off the computer system temporarily.

DISCLOSURE OF THE INVENTION

The present invention relates to a reset system for a microcomputer using program cartridges. Each cartridge is coupled to the computer through printed circuit board edge connectors which engage respective contacts in a socket mounted in the computer. One of the edge connectors includes a portion which extends into the area which would normally be occupied by an adjacent edge connector. The extending portion is shaped such that, as the cartridge is inserted into, or withdrawn from the socket, a temporary connection is made, through this edge connector, between corresponding adjacent contacts in the socket. A fixed potential on the contact which engages the main body of this edge connector, is, therefore, temporarily coupled to the adjacent contact to provide a reset signal from the adjacent contact to the microprocessor in the computer system. The fixed potential may be ground potential, in which case the reset signal comprises a reduction from a determined voltage level to zero during the temporary contact. As shown in the following description, the preferred configuration of the special edge connector is an L shape, with the horizontal arm running along the edge of the board.

BEST MODE FOR CARRYING OUT THE INVENTION

Figure 1:
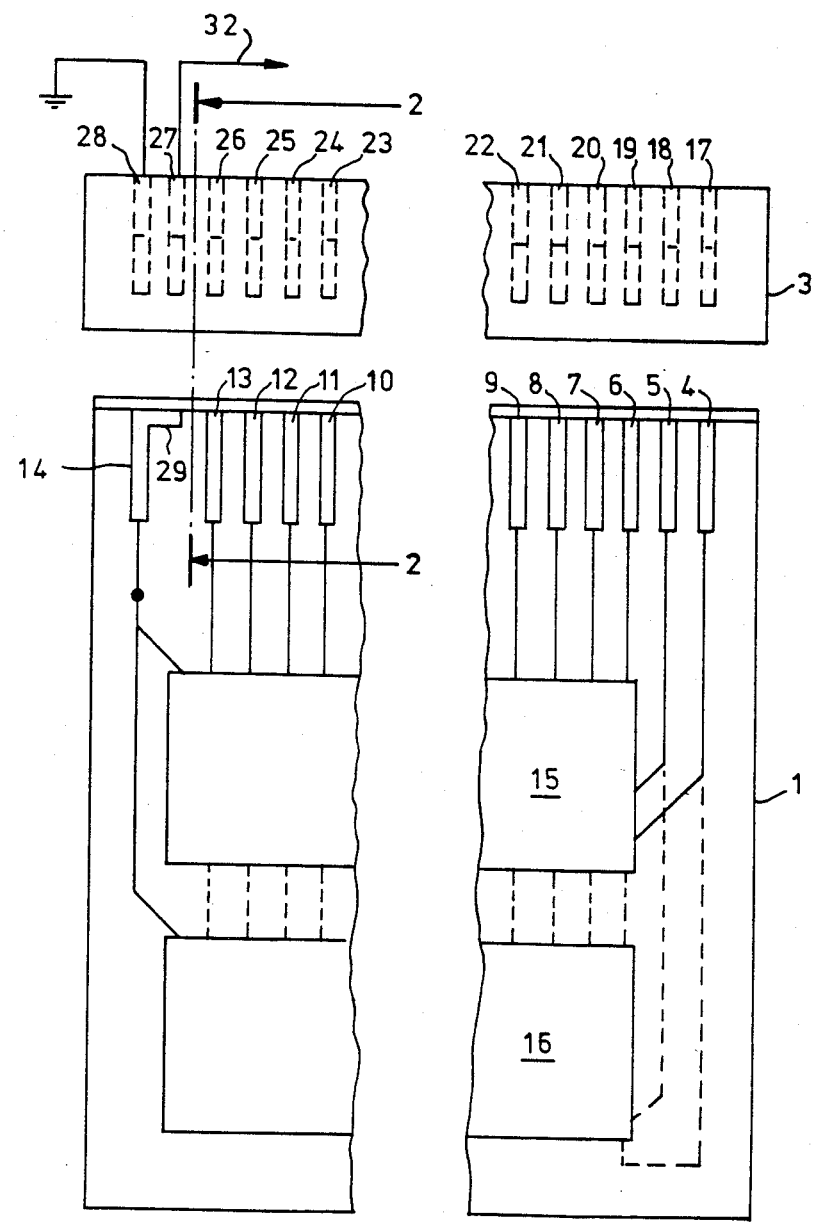
FIG. 1 is a top view of a plug-in cartridge read-only memory, device and its connector socket.
Figure 2:
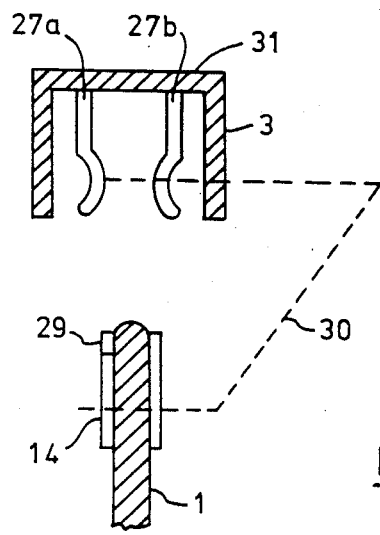
FIG. 2 is a cross-sectional view of the connector and part of the cartridge read-only memory device taken along the line 2—2 of FIG. 1.

FIG. 1 shows a cartridge read-only memory circuit board 1 and a connector socket device 3 for receiving board 1. In practise, board 1 would normally be contained within a protective cover, but this has not been shown for simplicity. Board 1 carries a plurality of edge connectors 4 through 14 which are connected to two ROM chips 15 and 16. Again, in order to simplify the drawing, the circuit board is only shown partially and only a few of the edge connectors are shown. In addition, as can be seen in FIG. 2, the reverse side of the board also carries a further set of edge connectors. Taking, as an example, the ROM chips 15 and 16 to be 32K MOS IG FET devices, each requires fifteen address lines which are commoned between the chips, an enable line, a chip select line, a power and an earth line, again commoned, and eight output lines. The connector socket comprises a housing 3, which is fixedly mountable in the frame of a microcomputer central processing unit. Housing 3 carries a plurality of pairs of resilient connector contacts 17 through 28 which engage the respective pairs of edge connectors on board 1 when the board is slotted into the connector socket.

The present invention is particularly concerned with the earth edge connector on board 1 and its connection to two of the contacts in the connector socket. As can be seen in FIG. 1, the earth edge connector, that is, connector 14, has a portion 29 which projects from the connector into the area of board 1 which would normally be occupied by an edge connector adjacent connector 14. The arrangement is such that as board 1 is slotted into the connector socket, projection 29 is momentarily engaged by the associated contact of connector contact pair 27. Similarly, when board 1 is removed from the connector socket, projection 29 is again momentarily engaged by this connector contact. The operation of the arrangement can be seen in more detail in FIG. 2. Here, the broken line 30 indicates the contact point of the edge connectors on board 1 and the contacts in the socket when the board is fully inserted into the socket. Thus, as the board is inserted, initially the edge connectors on board 1 make contact with their respective connector contacts and projection 29 contacts the left-hand contact 27a of pair 27a and 27b. Thereafter, as board 1 is further inserted towards its home position in which its upper end is adjacent the portion 31 of housing 3, projection 29 is cleared from contact 27a. Similarly, when board 1 is withdrawn, projection 29 contacts contact 27a for a period immediately preceding the complete withdrawal of board 1 from the socket.

Referring back to FIG. 1, it is seen that the result of the temporary connections between projection 29 and the socket contact is to earth a line 32 via socket contact 27, projection 29, connector 14 and contact 28, which, as shown, is earthed. Edge connector 14, of course, also provides the cartridge earth connection from socket 3.

Figure 3:
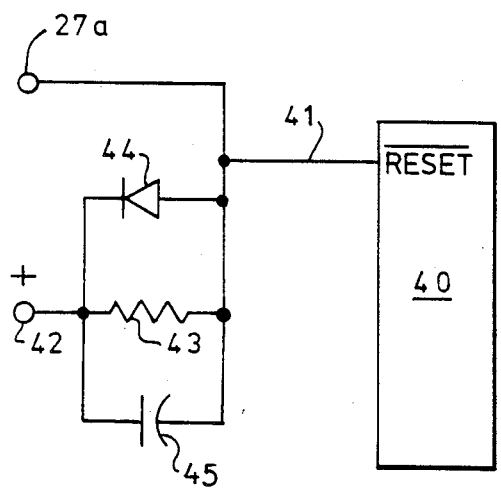
FIG. 3 is a simplified circuit showing the connection between the cartridge and a microprocessor device.

FIG. 3 is a highly simplified diagram showing the connection between contact 27a (FIG. 2) and a microprocessor 40. The microprocessor, in this case, is assumed to be on which is responsive to the lowering of a voltage on a NOT RESET input line 41 followed by a return to a high condition to switch to its reset state. With no external connection to contact 27a, and assuming a high input impedance at the microprocessor, the voltage on line 41 is substantially that of the supply voltage at terminal 42, as there is substantially no voltage drop across resistor 43. Whenever contact 27a is earthed by projection 29 (FIG. 2), the potential of line 41 drops to earth, and when it subsequently leaves the projection, the input rises back up to the supply level. The reset pulse is lengthened by the RC characteristics of resistor 43 and capacitor 45. Thus, whever the cartridge is entered into the socket or withdrawn therefrom, processor 40 is reset. Diode 44 provides a path to quickly discharge the capacitor when the system is powered down.

It is, of course, clear that contact 27a may be coupled to a RESET input of a microprocessor through an invert circuit. Alternatively, contact pad 14 may be the power supply pad for the cartridge so that, upon insertion or removal of the cartridge, a pulse at the supply voltage is produced on line 32 for a RESET input of the microprocessor.

The ROM cartridge, of course, provides program control data for a microcomputer system. Without some form of reset control when the cartridge is entered or withdrawn, noise signals generated thereby can cause significant problems. As this noise may be interpreted as program data, the computer may well attempt to execute the phantom instructions produced by the noise signals. These will at least produce error indications requiring action by the operator. The computer can, under some conditions produced by the phantom instructions, be forced into a 'hang' condition in which it waits for a further, non-existent instruction without the ability to return to its main control routine. In such a situation it may be impossible to reset the computer, and the only possible action is to switch it off completely and then switch on again. Depending on the complexity of the computer system, the power on sequence following the switch on can take various lengths of time, but in all cases it causes some delay. In the more sophisticated microcomputer systems, this power on sequence may include a check of the system, a keyboard check, an operating system load operation and peripheral device (e.g. diskette and hard disk) load operations. These operations may take a minute or more in some systems.

The reset system disclosed herein is simple, cheap to produce and effective. It will be noted that the reset signal is produced immediately after initial contact between the connector pads on the cartridge and the contacts on the cartridge holder. By the time the system has been reset, the contacts and pads are in wiping contact so that as soon as the cartridge is pushed to its home position further operations can continue. Similarly, when a cartridge is withdrawn, the reset signal occurs as the cartridge is finally exiting from the connector socket, so the system is again reset for the start of further operations.

While the invention has been described herein with reference to a particular embodiment, it will be understood by those skilled in the art that various changes in form and detail may be made without departing from the spirit and scope of the invention.

We claim:

1. A reset system for a microcomputer using program cartridges in which each cartridge includes a printed circuit board carrying a plurality of elongated parallel edge connectors of predetermined width extending from one edge of the board, and the microcomputer includes a socket having contact elements for slidably engaging successive longitudinal areas of corresponding edge connectors on insertion of the cartridge into, and on withdrawal of the cartridge from, the socket, and in which one of the edge connectors includes an arm portion of said predetermined width extending into a portion of the board which would normally be occupied by an adjacent edge connector, at a position for transient widthwise engagement by a corresponding socket contact element on said insertion and on said withdrawal to transiently connect said corresponding socket contact element to a first socket element contact in slidable engagement with said one of the edge connectors through said arm portion, means coupling a reset potential to said first socket contact element and means coupling said corresponding socket contact element to a reset input of a microprocessor in said microcomputer thereby to reset the microcomputer on said insertion and on said withdrawal.

2. A reset system according to claim 1, in which said one of the edge connectors is L shaped with said arm positioned parallel with, and adjacent to, said one edge of the board.

3. A reset system according to claim 1, in which said first socket contact element is coupled to ground of the microcomputer and a predetermined potential on said corresponding socket contact element is reduced to ground potential during said transient engagement.

4. A reset system according to claim 2, in which said first socket contact element is coupled to ground of the microcomputer and a predetermined potential on said corresponding socket contact element is reduced to ground potential during said transient engagement.

* * * * *